US009658376B2

(12) United States Patent
Henry

(10) Patent No.: US 9,658,376 B2
(45) Date of Patent: May 23, 2017

(54) POLARIZING ARTICLE AND METHOD FOR MAKING THE SAME

(71) Applicant: CORNING INCORPORATED, Corning, NY (US)

(72) Inventor: David Henry, Fontaine le Port (FR)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 14/625,942

(22) Filed: Feb. 19, 2015

(65) Prior Publication Data

US 2015/0301253 A1 Oct. 22, 2015

Related U.S. Application Data

(60) Provisional application No. 61/980,622, filed on Apr. 17, 2014.

(51) Int. Cl.
*G02B 1/14* (2015.01)
*G03C 7/12* (2006.01)
(Continued)

(52) U.S. Cl.
CPC ............. *G02B 5/3033* (2013.01); *C09D 4/06* (2013.01); *C09D 5/002* (2013.01); *G02B 1/14* (2015.01); *G02C 7/12* (2013.01); *G03F 7/027* (2013.01)

(58) Field of Classification Search
CPC . G02C 7/12; G02C 7/10; G02C 7/101; G02B 27/2228; G02B 5/305; G02B 1/14;
(Continued)

(56) References Cited

U.S. PATENT DOCUMENTS

| 2,400,877 A | 5/1946 | Dreyer |
| 4,648,925 A | 3/1987 | Goepfert et al. |

(Continued)

FOREIGN PATENT DOCUMENTS

| JP | 2005042072 | 2/2005 |
| WO | 2014062537 | 4/2014 |

OTHER PUBLICATIONS

International Search Report, issued in connection with corresponding PCT application No. PCT/US2015/025062, Apr. 9, 2015.

*Primary Examiner* — Bumsuk Won
*Assistant Examiner* — Henry Duong
(74) *Attorney, Agent, or Firm* — Robert L. Carlson

(57) ABSTRACT

A method of manufacturing a polarizing article including the steps of depositing a dichroic dye on a first surface of a substrate and fixing the dichroic dye to form a polarizing layer. The polarizing layer is impregnated with at least one silane compound to form an impregnated polarizing layer. A light curable primer is applied over the impregnated polarizing layer, and is cured using an irradiating light to form a cured primer layer. An abrasion resistant protective composition is applied to the cured primer layer, and the protective composition is cured to form a cured abrasion resistant protective coating. The light curable primer includes at least one (meth)acrylate reactive diluent, at least one unsaturated oligomer, and at least one photoinitiator for free radical-initiated polymerizations. The polarizing article includes a polarizing article made according to the method disclosed herein.

8 Claims, 1 Drawing Sheet

(51) Int. Cl.
*G02B 5/30* (2006.01)
*C09D 4/06* (2006.01)
*C09D 5/00* (2006.01)
*G02C 7/12* (2006.01)
*G03F 7/027* (2006.01)

(58) Field of Classification Search
CPC ........ G02B 5/3033; C09D 5/002; C09D 4/06;
C09D 133/066; C09D 133/14; C09D
133/08; C09D 133/02; C09D 175/16;
C09D 175/14; G03F 7/027; C08L 75/14;
C08L 33/0666; C08L 33/14; C08L 33/08;
C08L 33/02; C08L 75/16; C08F 220/26;
C08F 2220/281; C08F 2220/1875; C08F
220/06; C08F 220/28; C09J 133/14; C09J
133/08; C09J 133/02; C09J 133/066;
C09J 175/14; C09J 2433/00
USPC .......................................................... 351/49
See application file for complete search history.

(56) References Cited

U.S. PATENT DOCUMENTS

| | | | |
|---|---|---|---|
| 4,683,153 A | 7/1987 | Goepfert et al. | |
| 4,977,028 A | 12/1990 | Goepfert et al. | |
| 6,080,450 A * | 6/2000 | Cantor | C09D 4/00 427/517 |
| 7,625,626 B2 | 12/2009 | Bear et al. | |
| 8,529,059 B2 | 9/2013 | Suzuki | |
| 2007/0179224 A1* | 8/2007 | Fanayar | B29D 11/00903 524/100 |
| 2009/0053516 A1* | 2/2009 | Davidovits | G02B 5/3033 428/339 |
| 2011/0176104 A1* | 7/2011 | Suzuki | B29D 11/0073 351/159.75 |
| 2012/0270038 A1* | 10/2012 | Kim | C08F 290/067 428/336 |
| 2013/0196077 A1 | 8/2013 | Yajima et al. | |
| 2013/0244041 A1 | 9/2013 | Cho et al. | |

* cited by examiner

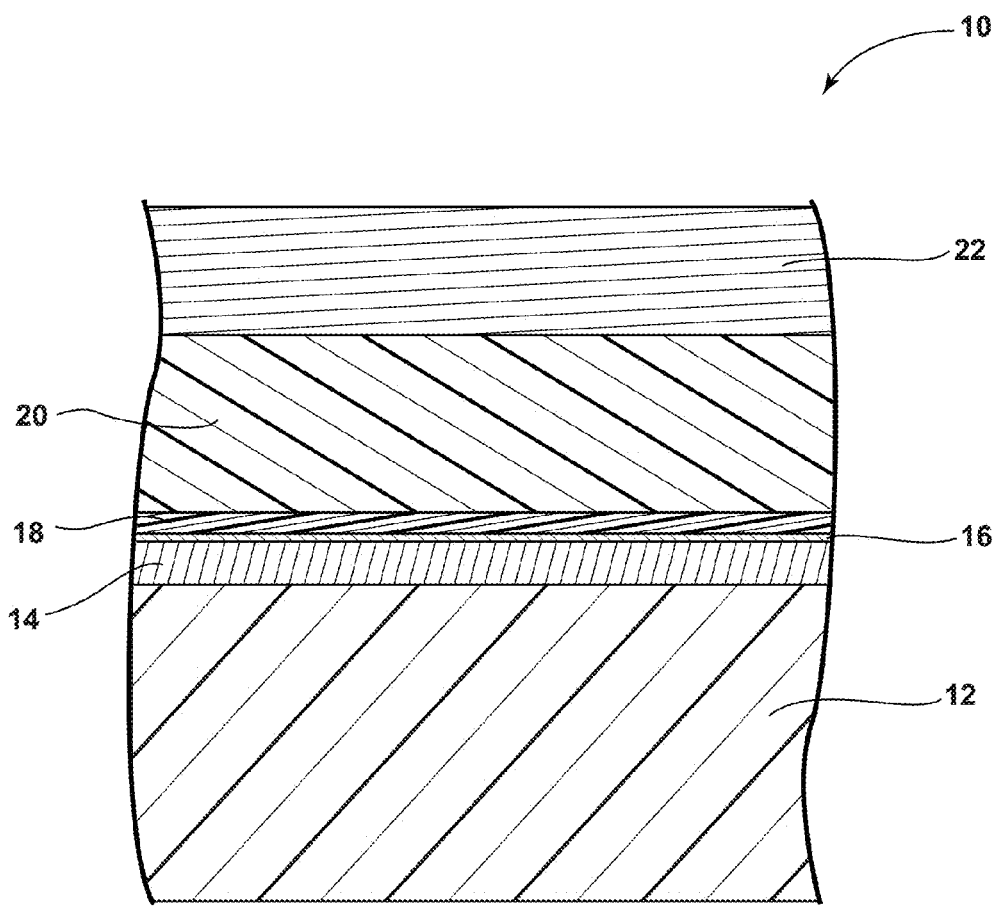

POLARIZING ARTICLE AND METHOD FOR MAKING THE SAME

This application claims the benefit of priority under 35 U.S.C. §119 of U.S. Provisional Application Ser. No. 61/980,622 filed on Apr. 17, 2014 the content of which is relied upon and incorporated herein by reference in its entirety.

FIELD

The present disclosure generally relates to a polarizing article incorporating a light curable primer, the light curable primer, and a method of manufacturing the polarizing article with the light curable primer.

BACKGROUND

Polarizing articles, including without limitation polarizing ophthalmic lenses, have the ability to selectively eliminate glare that is reflected from smooth horizontal surfaces such as water or ice. Dichroic materials are well-suited to the manufacture of polarizing articles. When properly oriented and deposited on a substrate, dichroic materials can preferentially transmit light polarized in a particular direction through the substrate. However, dichroic dye layers are often fragile, and susceptible to scratching and indentation upon impact. Additionally, abrasion resistant layers often have poor adhesion to the dichroic materials and have a tendency to delaminate from the dichroic materials, particularly under adverse conditions such as high humidity and heat in the environment. The present disclosure relates to a primer for application between the dichroic dye and the abrasion resistant layer to reduce delamination errors, and the primer disclosed herein is advantageously light curable, reducing the opportunity for defects due to deposition of dust or particulates while the primer is drying.

SUMMARY

According to one aspect of the present disclosure, a method of manufacturing a polarizing article includes the steps of depositing a dichroic dye on a first surface of a substrate and fixing the dichroic dye to form a polarizing layer. The polarizing layer is impregnated with at least one silane compound to form an impregnated polarizing layer. A light curable primer is applied over the impregnated polarizing layer, and is cured using an irradiating light to form a cured primer layer. An abrasion resistant protective composition is applied to the cured primer layer, and the protective composition is cured to form a cured abrasion resistant protective coating.

According to another aspect of the present disclosure, a light curable primer for adhering an abrasion resistant coating to a dichroic dye polarizing layer includes at least one (meth)acrylate reactive diluent, at least one unsaturated oligomer, and at least one photoinitiator for free radical-initiated polymerizations.

According to yet another aspect of the present disclosure, a polarizing article comprises a substrate having a top surface, and a polarizing layer comprising a fixed dichroic dye applied to the top surface of the substrate. A cured primer layer is disposed over the polarizing layer, wherein the cured primer layer includes a primer with at least one (meth)acrylate reactive diluent, at least one unsaturated oligomer, and at least one photoinitiator for free radical-initiated polymerizations that has been cured via application of an irradiating light to the primer. An abrasion resistant protective coating is disposed over the cured primer layer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

BRIEF DESCRIPTION OF THE DRAWINGS

The FIGURE is a cross sectional view of one embodiment of a polarizing article according to the present disclosure.

DETAILED DESCRIPTION

Reference will now be made in detail to the present preferred embodiments, examples of which are illustrated in the accompanying drawings. Whenever possible, the same reference numerals will be used throughout the drawings to refer to the same or like parts.

One preferred embodiment of the present disclosure includes a polarizing article, indicated as number 10 in the FIGURE, including a substrate 12 with a hard coating 14 and an adhesion promoting layer 16 on a first side of the substrate 12. An impregnated polarizing layer 18 is disposed on the adhesion promoting layer 16. A light cured primer layer 20 is disposed on the impregnated polarizing layer, and a cured abrasion resistant protective coating 22 is disposed on the cured primer layer 20. In alternate embodiments, particularly where the substrate 12 is comprised of an inorganic glass material, the hard coating 14, the adhesion promoting layer 16, or both can be omitted from the substrate 12. (As used herein, the term "substrate" can include the substrate 12 and any layers of hard coating 14 and adhesion promoting layer 16 applied thereto prior to the polarizing layer, unless the context requires otherwise.)

The polarizing articles 10 as described herein can be used for many purposes, including without limitation as corrective eyeglass lenses, sunglasses, protective glass, instrument lenses, window for vehicles or buildings, or for other display purposes.

Substrate:

The substrate 12 as described herein can be, for example, an inorganic glass material or a plastic material. Suitable plastic substrates 12 include without limitation homopolymers of methyl methacrylate, copolymers of methyl methacrylate with at least one other monomer, homopolymers of diethylene glycol bisallylcarbonate, copolymers of diethylene glycol bisallylcarbonate with at least one other monomer, copolymers containing sulfur, copolymers containing halogens, polycarbonates, polystyrene, polyvinyl chloride, unsaturated polyesters, polyethylene terephthalate, polyurethanes, polythiourethanes and polymers using compounds having epithio-group as a raw material. Certain commercial examples of such suitable substrates 12 include without limitation MR-8™ 1.60 high-index material or MR-8™, MR-7™ MR-™, MR-174™ materials available from Mitsui Chemicals, Inc., allyl diglycol carbonate sold under the trademark CR39™ by PPG Industries, Ormex™ and Orma™ materials both from Essilor, Trivex®, 1.53 resin from PPG Industries, and Airwear® polycarbonate from Essilor.

Where a plastic substrate 12 is used, an inorganic adhesion promoting layer 16 is preferably applied to a first surface of the substrate 12, with or without an optically clear hard coating 14, as is known, between the inorganic adhesion promoting layer 16 and the substrate 12. A polarizing dye is applied to the adhesion promoting layer 16 rather than directly to the plastic substrate 12, in order to enhance adhesion of the polarizing dye to the substrate 12. Preferably the inorganic adhesion promoting layer 16 comprises an $SiO_2$ or SiO material.

Polarizing Layer:

A polarizing dichroic dye is applied to the substrate 12 (or to the inorganic adhesion promoting layer 16, when used) to form a polarizing layer in situ. The substrate 12 or inorganic adhesion promoting layer 16 are prepared by brushing a surface thereof 12, 16 to produce microgrooves in the surface, and then washing and drying the surface. The polarizing dichroic dye is an organic dye exhibiting a nematic phase. The microgrooves in the surface align the molecules of the polarizing dichroic dye to give it a polarizing effect. In some embodiments, the dichroic dye includes an activator, which is optionally present at about 0.75%. After the polarizing dichroic dye is applied to the surface, it is treated with an ion exchange treatment to reduce water solubility and to fix the polarizing dichroic dye by ion exchange in an acidic solution. Fixing the dichroic dye reduces the likelihood that the dichroic dye will be solubilized or removed from the substrate 12 by subsequent processing steps or use of the polarizing article 10. One non-limiting example of such a solution is an aqueous solution of aluminum chloride, calcium hydroxide and magnesium hydroxide at a pH of about 3.5. The polarizing layer is optionally further impregnated with an aminopropylsilane and an epoxy silane to form the impregnated polarizing layer 18.

Light Curable Primer:

In a preferred embodiment, a light curable primer is applied over the impregnated polarizing layer 18 and cured to form a cured primer layer 20. Using a light curable primer allows the primer layer to be cured quickly, reducing the opportunity for any dust or dirt to settle on the polarizing article 10 during manufacture. The light curable primer disclosed herein also aids in adhering the abrasion resistant protective composition to the polarizing article 10 to seal and protect the polarizing layer. In one embodiment, the light curable primer includes at least one (meth)acrylate reactive diluent, at least one unsaturated oligomer, and at least one photoinitiator. Use of a light curable primer as disclosed herein provides high durability in humid environments. This is the case even if the embodiment of the light curable primer does not include reactive groups that are usually found in compositions intended to provide high durability in humid environments such as isocyanate, epoxy, anhydride, silane, silanol, or alkoxysilane.

One embodiment of a light curable primer includes from about 50 wt % to about 90 wt % of the (meth)acrylate reactive diluent, and preferably from about 55 wt % to about 85 wt % of the (meth)acrylate reactive diluent. The (meth)acrylate reactive diluents for use herein preferably each have only one unsaturated polymerizable group per molecule. The use of (meth)acrylate reactive diluents with a single unsaturated polymerizable group per molecule decreases the crosslinking density, thereby decreasing shrinkage and increasing adhesion of the light curable primer layer. The single unsaturated polymerizable group per molecule may also increase the extent of curing of the light curable primer.

The (meth)acrylate reactive diluents preferably include at least one of unsaturated monomers bearing an isobornyl group, unsaturated monomers bearing a carboxylic acid group, unsaturated monomers bearing a tetrahydrofurfuryl group, or unsaturated monomers bearing a hydroxyalkyl group. More preferably, a major component of the (meth) acrylate reactive diluents is the unsaturated monomer bearing the isobornyl group. In one preferred embodiment, the light curable primer includes a mixture of mono-unsaturated monomers used as (meth)acrylate reactive diluents, wherein the mono-unsaturated monomers are chosen from the following: isobornyl acrylate, acrylic acid, hydroxyethyl acrylate, and tetrahydrofurfuryl acrylate. In a particular preferred embodiment, the reactive diluents include isobornyl acrylate at 30 wt % to 55 wt % of the total mass of the light curable primer; acrylic acid at 5 wt % to 10 wt % of the light curable primer; hydroxyethyl acrylate at 8 wt % to 15 wt % of the light curable primer; tetrahydrofurfuryl acrylate at 5 wt % to 10 wt % of the light curable primer. Additional preferred (meth)acrylate reactive diluents include the following, without limitation: benzyl(meth)acrylate, lauryl acrylate, 2-ethyl hexyl acrylate, and phenoxyethyl acrylate.

The relatively larger percentage of isobornyl acrylate in the light curable primer is believed to enhance adhesion to the impregnated polarizing layer 18 by providing a high glass transition but very low shrinkage, and the isobornyl acrylate has low water sensitivity due to its hydrophobic nature. Isobornyl acrylate also enables low shrinkage upon curing of the light curable primer, which reduces the residual stress in the cured primer layer 20.

In certain preferred embodiments, the unsaturated monomer bearing a carboxylic acid group is chosen from the group consisting of acrylic acid, carboxyethyl acrylate, 2-carboxyethyl acrylate oligomers, mono-2-(methacryloyloxy)ethyl succinate, maleic anhydride, and a mixture thereof. The carboxylic acid groups in these unsaturated monomers are believed to act through acid/base or chelation interactions with chemical groups present in the impregnated polarizing layer 18, such as amino groups, hydroxyl groups, and metal atoms. Upon high temperature treatment, the carboxylic groups may covalently bond to nucleophilic groups.

The unsaturated oligomer used in the light curable primer is preferably incorporated from about 7 wt % to about 50 wt % of the light curable primer, and is preferably selected from among (meth)acrylates or epoxy(meth)acrylates, such as a diacrylate of bisphenol A based epoxy. In another embodiment, the at least one unsaturated oligomer includes a urethane acrylate compound or a urethane(meth)acrylate prepared by the reaction of aliphatic or aromatic polyisocyanates having at least two isocyanate groups in the molecule with at least one polyol and a subsequent endcapping of non-reacted terminal isocyanate groups with a compound having at least one acryloyloxy group or methacryloyloxy group and a hydroxyl group such as 2-hydroxyethyl acrylate, 2-hydroxypropyl acrylate, 3-hydroxypropyl acrylate, or 4-hydroxybutyl acrylate. Examples of organic polyisocyanates to be used as a raw material for producing the urethane prepolymer include without limitation 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, and ω,ω'-diisocyanatodimethylcyclohexane. Preferred polyols for reacting with the aliphatic or aromatic polyisocyanates include polyols having at least two hydroxyl groups and a molecular weight from 50 to 2000. In certain embodiments, a mixture of a high molecular weight polyol and a low molecular weight polyol are used. As used herein, high molecular weight polyols include without limitation polyether polyols, polyesterpolyols, polybutadiene polyols, hydrogenated polybutadiene polyols, and polycarbonate polyols. As used herein, low molecular weight polyols include without limitation ethylene glycol, diethylene glycol, triethylene glycol, propylene glycol, dipropylene glycol, 1,3-butanediol, 1,4-butanediol, pentaethylene glycol, hexamethylene glycol, neopentyl glycol, 2-ethyl-1,3-hexanediol, and bisphenol A. One preferred embodiment of the unsaturated oligomer includes a non-yellowing aliphatic urethane(meth)acrylate prepared from isocyanate.

The photoinitiator for free radical initiated polymerizations used in the light curable primer is preferably incorporated from about 0.5 wt % to about 6 wt %. Preferred photoinitiators include without limitation benzyldimethylketal (available as Irgacure™ 651 from BASF), alpha-aminoketone (available as Irgacure™ 369, Irgacure™ 907, or Irgacure™ 1300 from BASF), bis acyl phosphine oxide (available as Irgacure™ 819 from BASF), alpha-hydroxyketone (available as Irgacure™ 500, Irgacure™ 2959, Irgacure™ 184, or Darocure™ 1173 from BASF) or a mixture of these. A particularly preferred photoiniator is 1-hydroxy-cyclohexyl-phenyl-ketone (available as Irgacure™ 184 from BASF).

A solvent is optionally included in the light curable primer to adjust the viscosity of the light curable primer and control the thickness of the resulting cured primer layer 20. In one preferred embodiment, organic solvents are used to adjust the viscosity of the light curable primer and facilitate deposition of the light curable primer on the impregnated polarizing layer 18. Non-limiting examples of organic solvents include: alcohols such as methanol, ethanol, isopropanol, butanol, 2-methoxyethanol; glycol ethers such as n-dipropylene glycol n-propyl ether, ethylene glycol phenyl ether, propylene glycol methyl ether acetate, propylen glycol diacetate, propylene glycol methyl ether, propylene glycol n-butyl ether, propylene glycol n-propyl ether, tripropylene glycol methyl ether, dipropylene glycol methyl ether, dipropylene glycol methyl ether acetate, dipropylene glycol n-butyl ether, tripropylene glycol methyl ether. One preferred solvent is PM glycol ether, which offers better viscosity reduction than heavier molecular weight glycol ethers. Another preferred solvent is propylene glycol methyl ether. In another embodiment, water can be used as the solvent to adjust the viscosity of the light curable primer and to facilitate deposition of the light curable primer.

One preferred embodiment of the light curable primer includes a urethane diacrylate oligomer, isobornyl acrylate, acrylic acid, hydroxyethyl methacrylate, tetrahydrofurfuryl acrylate, and Irgacure® 184. In another preferred embodiment, the above constituents are present in the following weight percentages of the light curable primer: urethane diacrylate oligomer (17.5 wt %), isobornyl acrylate (50.7 wt %), acrylic acid (7.8 wt %), hydroxyethyl methacrylate (12.8 wt %), tetrahydrofurfuryl acrylate (8.2 wt %), and Irgacure® 184 (3 wt %).

Abrasion Resistant Coating:

The abrasion resistant protective coating 22 includes a layer formed by applying an abrasion resistant protective composition on top of the cured primer layer 20, and curing the protective composition. Light curable resins are preferred for use as the protective compositions based on workability of these types of resins. EB-curable resins or other types of resins can also be employed to form the abrasion resistant protective coating 22. One non-limiting example of a suitable abrasion resistant protective coating material is CRYSTALCOAT™ PDR34X1 available from SDC Technologies, Inc.

Manufacturing of the Polarizing Article:

To manufacture the polarizing article 10 described herein, in one preferred method the dichroic dye is deposited on the first side of the substrate 12. The dichroic dye is fixed to form the polarizing layer. The polarizing layer is then impregnated with the at least one silane compound to form the impregnated polarizing layer 18. The light curable primer is applied over the impregnated polarizing layer 18, and is cured using an irradiating light to form the cured primer layer 20. The abrasion resistant protective composition is applied over the cured primer layer 20, and is cured to form the cured abrasion resistant protective coating 22.

The first surface of the substrate 12 is preferably prepared with microgrooves in a desired direction to aid in the alignment of the dichroic dye molecules to exhibit a polarizing effect. Depending upon the material of the substrate 12 and the adhesion of the dichroic dye to the substrate 12, various treatments may be performed on the first surface of the substrate 12 to prepare the first surface of the substrate 12 for receiving the dichroic dye, such as applying the hard coat layer 14 and the adhesion promoting layer 16 comprised of an $SiO_2$ material, an SiO material, or a combination thereof, to the first surface and then abrading the adhesion promoting layer 16 of the substrate 12. The dichroic dye is then applied to the abraded first surface of the substrate 12 (or the adhesion promoting layer 16 of the substrate 12), where it forms a polarizing layer. In certain preferred methods, the substrate and the dichroic dye are heated prior to applying the dichroic dye. Suitable methods for depositing the dichroic dye on the first surface include without limitation dip coating, flow coating, spray coating, spin coating. Preferred methods include dip and spin coating.

The polarizing layer is then fixed by conducting an ion exchange treatment. To perform the ion exchange treatment, a solution containing a metal, preferably in the form of a metal salt such as an aluminum salt, is applied to the surface of the polarizing layer. In one preferred embodiment, the substrate 12 with the polarizing layer thereon is immersed in an aqueous solution containing aluminum chloride, calcium hydroxide and magnesium hydroxide at a pH of about 3.5. After fixing the polarizing layer, the polarizing layer is preferably impregnated with at least one silane compound to form the impregnated polarizing layer 18. Non-limiting examples of silanes for impregnating the polarizing layer include an aminopropylsilane, and an epoxy silane. In one preferred method, the substrate with the fixed polarizing layer thereon is immersed in an aqueous solution containing an amino silane and then rinsed, and cured. Then the substrate with the polarizing layer is immersed in another aqueous solution containing an epoxy silane, and then rinsed and cured. One non-limiting example of a suitable amino silane is 3-aminopropyltriethoxysilane and one non-limiting example of a suitable epoxy silane is 3-glycidoxypropyltrimethoxysilane. Upon ion exchange treatment and treatment with the silanes, the polarizing layer is converted to the impregnated polarizing layer 18.

The light curable primer, as described above, is applied to the impregnated polarizing layer 18 and is then cured using an irradiating light source to form the cured primer layer 20. Suitable methods for depositing the light curable primer include without limitation dip coating, flow coating, spray coating, spin coating. Preferred methods include dip and spin coating. However, the method of applying the coating may vary based on the viscosity and other properties of the light curable primer. The thickness of the cured primer layer 20 is preferably in the range of 3.0 μm to 10.0 μm, and more preferably in the range of 6.0 μm to 10.0 μm.

The protective composition, as described above, is applied to the cured primer layer 20, and is then cured using an irradiating light source to form the cured abrasion resistant protective coating 22. Suitable methods for depositing the protective composition include without limitation dip coating, flow coating, spray coating, spin coating. Preferred methods include dip and spin coating. However, the method of applying the protective composition may vary based on the viscosity and other properties of the protective composition. The thickness of the cured abrasion resistant layer is preferably in the range of 4.0 μm to 10.0 μm.

Example 1

In one example, a hard coating is applied in a 2 μm thick layer on a convex side of a cleaned MR8 lens, followed by a $SiO_2$ layer having a thickness of 260 nm to form a substrate for a polarizing coating. The $SiO_2$ layer was brushed with a wheel of polyurethane foam and having the appropriate shape, wherein the wheel was imbibed with an abrasive slurry to form parallel microgrooves on the surface of the $SiO_2$ layer. The abrasive slurry was about 12 wt % mixture of water and micrometer-sized alumina particles, to provide gentle abrasive rubbing. The wheel rotated at about 339 rotations per minute ("rpm"). The coated lens substrate was supported in a holder and brought into contact with the wheel for about 10 to about 13 seconds, at a force of about 2 kg. After abrading the lens, the abraded lens substrate was rinsed with deionized water.

The abraded lens substrate was coated with about 2 g of an aqueous solution containing a polarizing dichroic dye to form a polarizing layer on the lens substrate. The solution included the polarizing dye and an activator, with the activator present at about 0.75 wt %. The lens substrate was preheated to 48° C. and coated with the aqueous solution in a humid atmosphere (18 g of water per kg of air). The dye solution was preheated to 51° C. and dispensed using the spin coating process at about 165 rpm for about 2 seconds, then the spinning speed was increased to about 295 rpm and maintained for about 35 seconds and then increased again to about 995 rpm for about 5 seconds. Following application of the dichroic polarizing dye to form the polarizing layer, the lens substrate exhibited a polarization efficiency of about 99.5% and a transmittance of about 33%.

The polarizing layer was stabilized by immersing the lens substrate with the polarizing layer for about 30 seconds in an aqueous solution containing aluminum chloride, calcium hydroxide and magnesium hydroxide at a pH of about 3.5. This step converted the water soluble polarizing dye to its water insoluble form. The lens substrate and polarizing dye were rinsed with deionized water for 2 minutes. Next, the lens substrate with the polarizing layer was dipped in an about 10 wt % aqueous solution of 3-aminopropyltriethoxysilane[919-30-2] for about 15 minutes, rinsed with deionized water 3 times, and cured at about 60° C. for about 60 minutes. After cooling, the substrate lens with the polarizing layer was immersed in an about 2 wt % aqueous solution of 3-glycidoxypropyltrimethoxysilane[2530-83-8] for about 30 minutes, rinsed with deionized water and cured in an oven at about 60° C. for about 60 minutes. The treatment with aluminum chloride, calcium hydroxide, magnesium hydroxide, 3-aminopropyltriethoxysilane, and 3-glycidoxypropyltrimethoxysilane results in the impregnated polarizing layer.

After cooling, a light curable primer was dispensed on the impregnated polarizing layer on the convex surface of the lens substrate. The light curable primer includes about 43.88 wt % of a multifunctional urethane acrylate oligomer resin, about 8.56 wt % hydroxyethyl methacrylate, about 33.92 wt % isobornyl acrylate, about 5.15 wt % acrylic acid, about 5.49 wt % tetrahydrofurfuryl acrylate and about 3 wt % Irgacure® 184 as the photoinitiator, which is available as Vitralit™ 7565 from Eleco Produit Efd. The primer had a viscosity of about 4.6 Pa·s and contains about 53 wt % of (meth)acrylate reactive diluents. The light curable primer was coated to form a primer layer by spin coating at 1,000 rpm for 15 seconds, followed by a step at 6100 rpm for about 90 seconds. Thereafter, the coated primer layer was cured by exposure to UV light from a fusion bulb D lamp at a belt speed of about 0.8 meters per minute (2 passes) to form a cured primer layer. The dose of UVA (320-390 nm) light applied to the primer layer was about 13,500 mJ/cm$^2$ and the dose of UVV (395-445 nm) light applied to the primer layer was about 15,800 mJ/cm$^2$. The final thickness of the cured primer layer was about 10 μm.

Finally, a protective composition comprising an abrasion resistant coating resin was applied over the cured primer layer and was cured to form a cured abrasion resistant protective coating. The abrasion resistant coating resin used is sold under the reference 34X1 from SDC Technologies, Inc. The resin was dispensed by spin coating at a speed of about 500 rpm for about 20 seconds, followed by a step at 3,400 rpm for about 45 seconds and was cured by exposure to UV light from a fusion bulb H lamp at a belt speed of about 1.5 meters per minute (1 pass) to form the cured abrasion resistant protective coating. The dose of UVA light applied to the abrasion resistant coating resin was about 1,340 mJ/cm$^2$ and the dose of UVV light applied to the abrasion resistant coating resin was about 2,200 mJ/cm$^2$. The resulting cured abrasion resistant protective coating had a thickness of about 4.0 μm.

The thickness of the cured primer layer and the cured abrasion resistant protective coating (together, the total protective multilayer thickness) was about 14 μm and the resulting polarizing article exhibited a polarization efficiency of about 99% and a transmittance of about 32%.

Example 2

In another example, the same process was carried out as described in example 1, except that the light curable primer layer was prepared by mixing 40 parts of Vitralit™ 7565, 60 parts of Dowanol PM™, and 0.1 parts of silicone-based surfactant "L7001" manufactured by Toray Dow Corning Co., Ltd. The light curable primer had a viscosity of 0.1 Pa·s and 53 wt % of (meth)acrylate reactive diluents (based on the solid content of the light curable primer).

This light curable primer was dispensed onto the convex surface of the polarizing layer on the substrate by spin coating at 400 rpm for 10 seconds, followed by a step at 800 rpm for 15 seconds. Thereafter, the primer layer was cured by exposure to UV light from a fusion bulb D lamp at a belt speed of about 0.8 meters per minute (2 passes). The dose of UVA light was about 13,500 mJ/cm$^2$ and the dose of UVV light was about 15,800 mJ/cm$^2$. The thickness of the cured primer layer was about 8-9 μm.

The 34X1 abrasion resistant coating resin was applied and cured as described in example 1, resulting in a total protective multilayer thickness of about 13 μm and the polarizing article exhibited a polarization efficiency of about 99% and a transmittance of about 32%.

Although a solventless light curable primer is preferred, the present example illustrates that a solvent can be added without negatively impacting the efficiency of the primer.

Example 3

In yet another example, the same process was carried out as described in example 1, except that the light curable primer layer was prepared by mixing 40 parts of Vitralit™ 7565 and 60 parts of a reactive diluent which was made by blending 2.9 parts of Irgacure® 184, 15.7 parts hydroxyethyl methacrylate, 61.87 parts isobornyl acrylate, 9.49 parts acrylic acid, and 10.04 parts tetrahydrofurfuryl acrylate. The light curable primer had a viscosity of 0.1 Pa-s and is solventless. The light curable primer composition contained 79.5 wt % reactive diluent.

This light curable primer was dispensed on the impregnated polarizing layer by spin coating at 400 rpm for 6 sec, followed by a step at 1,850 rpm for 45 seconds. Thereafter, the light curable primer was cured by exposure to UV light from a fusion bulb D lamp equipped with a IR KG1 filter available from Schott to remove the near IR thermal energy from the light at a belt speed of about 0.8 meters per minute (3 passes). The dose of UVA light was about 14,500 mJ/cm$^2$ and the dose of UVV light was about 19,700 mJ/cm$^2$. The final thickness of the cured primer layer was about 7.0 μm.

The 34X1 abrasion resistant coating resin was applied and cured as described in example 1. At this step the total protective multilayer thickness was about 11 μm and the polarizing article exhibited a polarization efficiency of about 99% and a transmittance of about 32%.

Example 4

In yet another example, the same process was carried out as described in example 1, except that the urethane acrylate oligomer used in the light curable primer was synthesized as follows: 1 mole of poly(polytetrahydrofuran carbonate)diol average (CAS Number 92538-66-4, Mn 1,000) was reacted with 2 moles of isophorone diisocyanate (CAS Number 4098-71-9) and 2 moles of 2-hydroxyethyl acrylate (CAS Number 818-61-1) under dry argon and using a catalytic amount of dibutyltin dilaurate (CAS Number 77-58-7).

The light curable primer was then prepared by mixing 17.5 parts of the urethane acrylate compound prepared as described above and 82.5 parts of reactive diluent which was made by blending 3.0 parts of Irgacure® 184, 12.8 parts hydroxyethyl methacrylate, 50.7 parts isobornyl acrylate, 7.8 parts acrylic acid, and 8.20 parts tetrahydrofurfuryl acrylate. The light curable primer had a viscosity of 0.1 Pa-s. The light curable primer contained 79.5% reactive diluent.

The light curable primer was dispensed on the impregnated polarizing layer by spin coating at 500 rpm for 20 seconds, followed by a step at 1,650 rpm for 22 seconds. Thereafter, the light curable primer was cured by exposure to UV light from a fusion bulb D lamp equipped with a IR KG1 filter available from Schott to remove the near IR thermal energy from the light at a belt speed of about 0.8 meters per minute (3 passes). The dose of UVA light was about 14,900 mJ/cm$^2$ and the dose of UVV light was about 18,970 mJ/cm$^2$. The thickness of the cured primer layer was about 6.0 μm.

The 34X1 abrasion resistant coating resin was applied and cured as described in example 1. The total protective multilayer thickness was about 10 μm and the polarizing article exhibited a polarization efficiency of about 99% and a transmittance of about 32%.

Comparative Example 1

In a comparative example, the same process was carried out as described in Example 1, except that the light curable primer layer was omitted. The 34X1 abrasion resistant coating resin was applied directly on the impregnated polarizing layer. The polarizing article exhibited a polarization efficiency of about 99% and a transmittance of about 32%.

Polarization Efficiency:

In all of the above described examples, the polarization efficiency ($P_{\it eff}$) was determined by measuring the parallel transmittance (T//) and perpendicular transmittance ($T^\perp$) using a visible spectrophotometer and a polarizer. The polarization efficiency was calculated using the following formula:

$$P_{\it eff}(\%)=[T//-T^\perp)/(T//\pm T^\perp)]\times 100.$$

Adhesion Testing:

The adhesion level for each of the above described example polarizing articles was evaluated by trying to peel off the coatings by means of a 3M adhesive tape after crosscuts were made according to ASTM D3359 method D. The adhesive performance of the polarizing articles that were prepared was evaluated immediately following fabrication. Ratings were done according to the ASTM D3359 method. Lenses that exhibited adhesion of between 4B and 5B were rated "0," whereas lenses giving adhesion lower than 4B were rated "X". Adhesion level was evaluated on both dry lenses and lenses after soaking in 90° C. hot water for 2 hours.

Characteristics of the polarizing articles created according to the above described examples are provided in Table 1, below.

TABLE 1

Characteristics of Polarizing Articles

| | Primer thickness (μm) | % (meth)acrylate reactive diluent in the primer composition | Overall protective layer thickness (μm) | Polarization efficiency (%) | Dry adhesion | Adhesion after hot water treatment |
|---|---|---|---|---|---|---|
| Example 1 | 10 | 53 | 14 | 99 | ○ (4-5B) | ○ (4-5B) |
| Example 2 | 9 | 53 | 13 | 99 | ○ (4-5B) | ○ (4-5B) |
| Example 3 | 7 | 79.5 | 11 | 99 | ○ (4-5B) | ○ (4-5B) |

TABLE 1-continued

Characteristics of Polarizing Articles

| | Primer thickness (μm) | % (meth)acrylate reactive diluent in the primer composition | Overall protective layer thickness (μm) | Polarization efficiency (%) | Dry adhesion | Adhesion after hot water treatment |
|---|---|---|---|---|---|---|
| Example 4 | 6 | 79.5 | 10 | 99 | ○ (4-5B) | ○ (4-5B) |
| Comp. Ex 1 | 0 | — | 4 | 99 | X (1B) | X (0B) |

As shown in Table 1, in the polarizing articles 10 produced as described in examples 1 to 4, in which a cured primer layer 20 containing high amount of reactive diluents was formed on an impregnated polarizing layer 18, there was no film separation, and enhanced adhesion ratings of 4-5B were achieved for samples tested as-cured or after severe humidity exposure by using the light curable primer. In contrast, film separation occurred in Comparative Example 1, in which a light curable abrasion resistant coating 22 was applied directly on top of the impregnated polarizing layer 18.

It will be apparent to those skilled in the art that various modifications and variations can be made without departing from the spirit or scope of the claims.

What is claimed is:

1. A method of manufacturing a polarizing article, comprising the following steps:
   brushing a first surface of a substrate to produce microgrooves in the first surface;
   depositing a dichroic dye on the microgrooves in the first surface of the substrate and fixing the dichroic dye on the substrate with an ion exchange treatment in an acidic solution to form a polarizing layer on the substrate;
   applying a light curable primer over the polarizing layer;
   curing the light curable primer using an irradiating light to form a cured primer layer;
   applying an abrasion resistant protective composition to the cured primer layer; and
   curing the protective composition to form a cured abrasion resistant protective coating;
   wherein curable primer comprises:
      at least one (meth)acrylate reactive diluent;
      at least one unsaturated oligomer; and
      at least one photoinitiator for free radical-initiated polymerizations;
   wherein the at least one (meth)acrylate reactive diluent is present from 50 wt % to 90 wt % of the primer, the at least one unsaturated oligomer is present from 7 wt % to 50 wt %, and the at least one photoinitiator is present from 0.5 wt % to 6 wt %.

2. The method of claim 1, wherein the cured primer layer has a thickness of from 3.0 μm to 10.0 μm.

3. The method of claim 1, wherein the substrate is a plastic material, and further comprising the steps of:
   applying an inorganic adhesion promoting layer to the first surface of the substrate comprised of an $SiO_2$ material, an SiO material, or a combination thereof; and
   depositing the dichroic dye over the inorganic adhesion promoting layer.

4. The method of claim 1, wherein the steps of forming and fixing the polarizing layer further comprising the step of:
   impregnating the polarizing layer with at least one silane compound, wherein the silane compound is an aminopropylsilane or an epoxy silane.

5. A polarizing article, comprising:
   a substrate having microgrooves in a top surface;
   a polarizing layer comprising a dichroic dye applied to the microgrooves in the top surface of the substrate;
   a cured primer layer disposed over the polarizing layer, wherein the cured primer layer comprises a primer including at least one (meth)acrylate reactive diluent, at least one unsaturated oligomer, and at least one photoinitiator for free radical-initiated polymerizations that has been cured via application of an irradiating light to the primer; and
   an abrasion resistant protective coating disposed over the cured primer layer;
   wherein that at least one (meth)acrylate reactive diluent comprises an unsaturated monomer bearing an isobornyl group, an unsaturated monomer bearing a carboxylic acid group, an unsaturated monomer bearing a tetrahydrofurfuryl group, and an unsaturated monomer bearing a hydroxyalkyl group;
   wherein the substrate comprises:
      a plastic material having a hard coating applied to a first surface thereof; and
      an inorganic adhesion promoting layer applied to the hard coating, wherein the inorganic adhesion promoting layer forms the top surface of the substrate.

6. The polarizing article of claim 5, wherein the polarizing article is a lens for eyeglasses.

7. The polarizing article of claim 5, wherein the at least one (meth)acrylate reactive diluent in the cured primer layer includes a mixture of mono-unsaturated monomers comprising:
   30 to 55 wt % of the total mass of the light curable primer of isobornyl acrylate;
   5 to 10 wt % of the total mass of the light curable primer of acrylic acid;
   8 to 15 wt % of the total mass of the light curable primer of hydroxyethyl acrylate; and
   5 to 10 wt % of the total mass of the light curable primer of tetrahydrofurfuryl acrylate.

8. The polarizing article of claim 5, wherein the cured primer layer has a thickness of between 3.0 μm and 10.0 μm.

* * * * *